United States Patent
Lee et al.

(10) Patent No.: US 8,963,871 B2
(45) Date of Patent: Feb. 24, 2015

(54) HANDHELD DEVICE CAPABLE OF AUTOMATICALLY SWITCHING BETWEEN A HANDHELD MODE AND A NON-HANDHELD MODE AND CONTROL METHOD THEREOF

(71) Applicant: HTC Corporation, Taoyuan County (TW)

(72) Inventors: Hsin-Hao Lee, Taoyuan County (TW); Chia-Jun Chia, Taoyuan County (TW)

(73) Assignee: HTC Corporation, Taoyuan Dist., Taoyuan (TW)

( * ) Notice: Subject to any disclaimer, the term of this patent is extended or adjusted under 35 U.S.C. 154(b) by 0 days.

(21) Appl. No.: 13/901,557

(22) Filed: May 23, 2013

(65) Prior Publication Data

US 2013/0249845 A1 Sep. 26, 2013

Related U.S. Application Data

(62) Division of application No. 13/038,367, filed on Mar. 1, 2011.

(30) Foreign Application Priority Data

Mar. 11, 2010 (TW) .............................. 99107136 A

(51) Int. Cl.
*G06F 3/041* (2006.01)
*G06F 1/16* (2006.01)
(Continued)

(52) U.S. Cl.
CPC ............ *G06F 3/0412* (2013.01); *G06F 1/1626* (2013.01); *G06F 1/1684* (2013.01);
(Continued)

(58) Field of Classification Search
USPC ......................................................... 345/173
See application file for complete search history.

(56) References Cited

U.S. PATENT DOCUMENTS 8,330,735 B2 * 12/2012 Lin et al. ........................ 345/173
2001/0044318 A1 * 11/2001 Mantyjarvi et al. ........... 455/550
(Continued)

FOREIGN PATENT DOCUMENTS

CN 101076771 A 11/2007
CN 101676842 A 3/2010
(Continued)

OTHER PUBLICATIONS

Office action mailed on Feb. 6, 2013 for the Taiwan application No. 099107136, filing date Mar. 11, 2010, p. 1-6.
(Continued)

*Primary Examiner* — Charles V Hicks
(74) *Attorney, Agent, or Firm* — Winston Hsu; Scott Margo

(57) ABSTRACT

A handheld device is provided. The handheld device may include a sensing unit, a control unit, an operating unit, a counting module and a mode control unit. The sensing unit is for generating a sensing result based on whether a user touch is received or not. The control unit is for sending out a periodic pulse to the sensing unit, and for periodically charging and discharging the sensing unit. The counting module is for counting a pulse number of the periodic pulse, and for outputting a counting value when the sensing result indicates that the user touch is received. The operating unit is for generating a mode control signal according to the counting value. The mode control unit is for controlling the handheld device to stay in a handheld mode or a non-handheld mode according to the mode control signal.

15 Claims, 7 Drawing Sheets

(51) Int. Cl.
　　*G06F 3/01*　　(2006.01)
　　*H03K 17/96*　　(2006.01)
　　*H04M 1/725*　　(2006.01)

(52) U.S. Cl.
　　CPC ............. *G06F 3/011* (2013.01); *H03K 17/962* (2013.01); *H04M 1/72563* (2013.01); *H03K 2217/960715* (2013.01); *H04M 2250/22* (2013.01)
　　USPC ........................................................ 345/173

(56) References Cited

U.S. PATENT DOCUMENTS

| 2008/0204422 | A1 | 8/2008 | Moon |
| 2011/0120784 | A1* | 5/2011 | Osoinach et al. .......... 178/18.06 |

FOREIGN PATENT DOCUMENTS

| TW | 200920061 | 5/2009 |
| TW | M371930 | 1/2010 |
| WO | 2009142345 A1 | 11/2009 |

OTHER PUBLICATIONS

Siao-Ping Wong, "Touch Sensing Technology and Application Thereof—Based on CapSense", Beihang University Press, p. 15-16. Jan. 31, 2010.

Office action mailed on Jan. 31, 2013 for the China application No. 201010157615.7, filing date Apr. 1, 2010, p. 1-10.

Office action mailed on May 9, 2013 for the U.S. Appl. No. 13/038,367, filed Mar. 1, 2011, p. 1-22.

Office action mailed on Jun. 30, 2014 for the U.S. Appl. No. 13/038,367, filed Mar. 1, 2011, p. 1-18.

* cited by examiner

HANDHELD DEVICE CAPABLE OF AUTOMATICALLY SWITCHING BETWEEN A HANDHELD MODE AND A NON-HANDHELD MODE AND CONTROL METHOD THEREOF

CROSS REFERENCE TO RELATED APPLICATIONS

This application is a divisional application of, and claims the priority benefit of, U.S. application Ser. No. 13/038,367 filed on Mar. 1, 2011.

BACKGROUND OF THE INVENTION

1. Field of the Invention

The present invention relates to a handheld device capable of automatically switching handheld mode/non-handheld mode and related control methods, and more particularly, to a handheld device and related control methods for sensing whether a user touch is received or not via a sensing unit and for controlling the sensing unit via a control unit in order to differentiate handheld behaviors from non-handheld behaviors.

2. Description of the Prior Art

With the flourish developments of the wireless communication network in the modern information society, handheld devices, such as mobile phones and personal digital assistants (PDAs) have become one of the most popular communication tools. However, although the handheld device is defined as "a device to be held by a hand of a user", the existing handheld device itself is unable to know whether it is held by the hand of a user and is unable to automatically adjust settings of the handheld device in response to "handheld behaviors" and "non-handheld behaviors". For this reason, it's a "smart" handheld device cannot be created, which causes inconvenience to the users in many applications.

Hence, how to enhance the convenience of the handheld devices and add more functionality to the handheld devices have become one of important topics in this field.

SUMMARY OF THE INVENTION

It is one of the objectives of the claimed invention to provide a handheld device capable of automatically switching handheld mode/non-handheld mode and related control methods to solve the abovementioned problems.

According to one embodiment, a handheld device capable of automatically switching handheld mode/non-handheld mode is provided. The handheld device may include a sensing unit, a control unit, an operating unit, a counting module and a mode control unit. The sensing unit is arranged for generating a sensing result based on whether a user touch is received or not. The control unit is arranged for sending out a periodic pulse to the sensing unit, and for making use of the periodic pulse to periodically charge and discharge the sensing unit. The counting module is coupled to the control unit and the sensing unit, and is arranged for counting a pulse number of the periodic pulse, and for outputting a counting value when the sensing result indicates that the user touch is received. The operating unit is coupled to the counting module, and is arranged for generating a mode control signal according to the counting value. The mode control unit is coupled to the operating unit, and is arranged for controlling the handheld device to stay in a handheld mode or a non-handheld mode according to the mode control signal. In one embodiment, the counting module may include a counter and a voltage comparator.

According to another embodiment, a method for controlling modes of a handheld device is provided. The method includes the following steps: sending out a periodic pulse to a sensing unit, and making use of the periodic pulse to periodically charge and discharge the sensing unit; the sensing unit generating a sensing result based on whether a user touch is received or not; counting a pulse number of the periodic pulse, and outputting a counting value when the sensing result indicates that the user touch is received; generating a mode control signal according to the counting value; and controlling the handheld device to stay in a handheld mode or a non-handheld mode according to the mode control signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
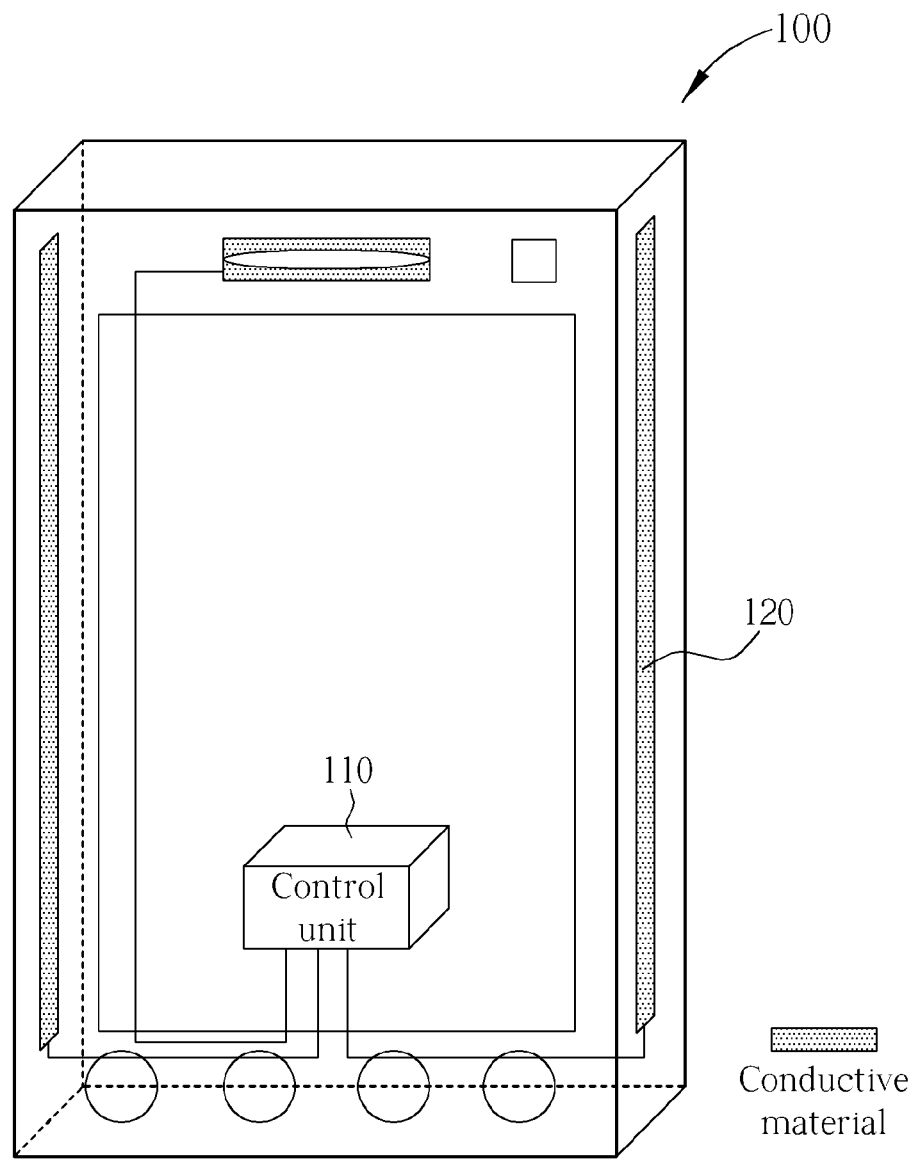
FIG. 1 is diagram of a handheld device capable of automatically switching handheld mode/non-handheld mode according to an embodiment of the present invention.
Figure 2:
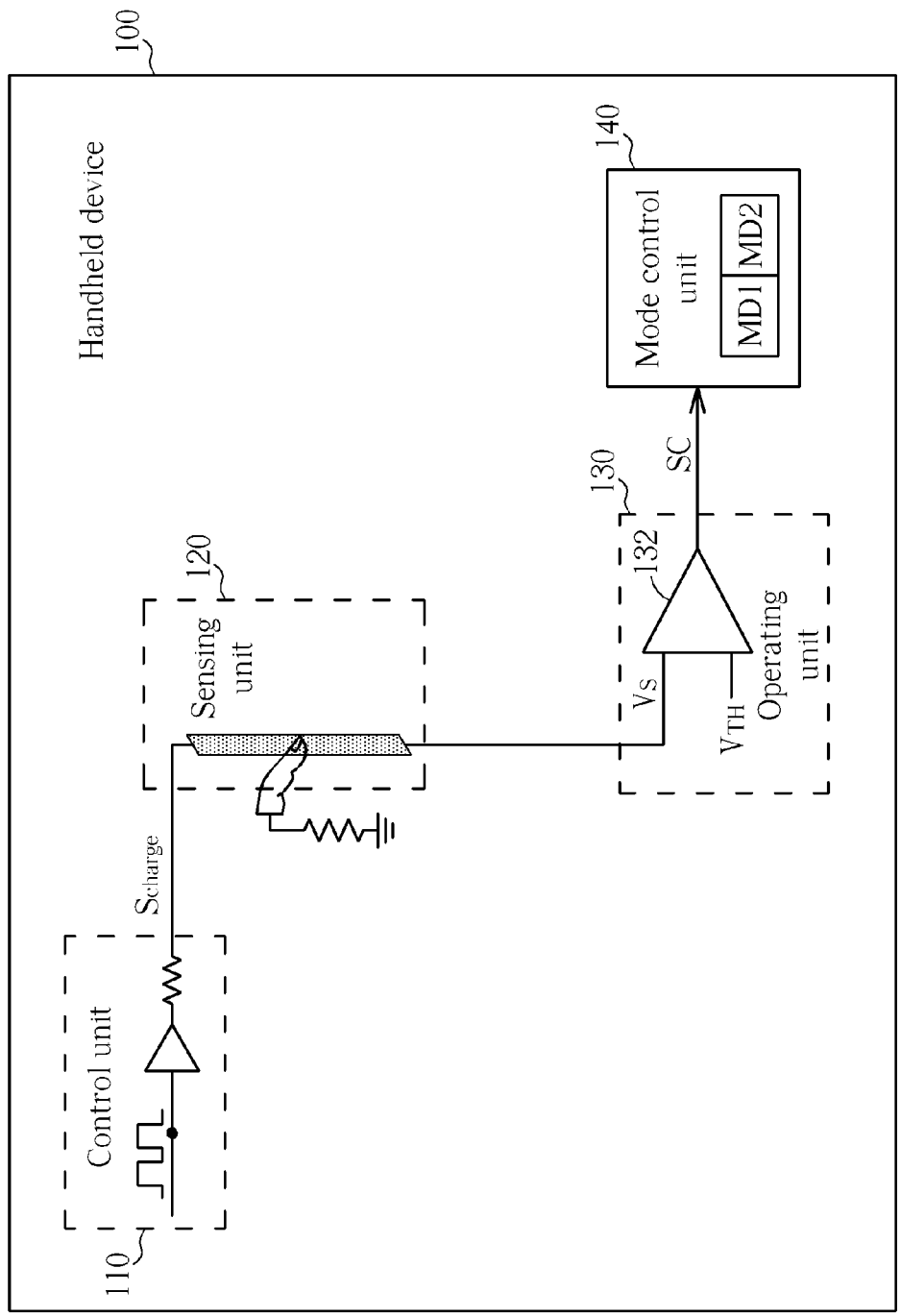
FIG. 2 is a block diagram illustrating the handheld device shown in FIG. 1 according to a first embodiment of the present invention.

Please refer to FIG. 1 together with FIG. 2. FIG. 1 is diagram of a handheld device 100 capable of automatically switching handheld mode/non-handheld mode according to an embodiment of the present invention, and FIG. 2 is a block diagram illustrating the handheld device 100 shown in FIG. 1 according to a first embodiment of the present invention. As shown in FIG. 1, the handheld device 100 may include a control unit 110 and a sensing unit 120. In this embodiment, the sensing unit 120 may be implemented by a conductive material, wherein the conductive material may be attached to the outside surface of the housing of the handheld device 100 or may be embedded in the housing of the handheld device 100. In addition, the sensing unit 120 can be used for sensing whether a user touch is received or not by way of indirect induction or direct contact. The control unit 110 is coupled to the sensing unit 120, and is arranged for controlling operations of the sensing unit 120.

As shown in FIG. 2, the handheld device 100 may include, but is not limited to, a control unit 110, a sensing unit 120, an operating unit 130, and a mode control unit 140. The control unit 110 is arranged for sending out a charging-and-discharging signal Scharge to the sensing unit 120, and for making use of the charging-and-discharging signal Scharge to charge and discharge the sensing unit 120. In this embodiment, the charging-and-discharging signal Scharge may be a periodic pulse, and thus the control unit 110 may utilize the periodic pulse to periodically charge and discharge the sensing unit 120. The sensing unit 120 is coupled to the control unit 110, and may be arranged for generating a sensing result based on whether a user touch is received or not. In this embodiment, the sensing result generated by the sensing unit 120 may be implemented by a sensing voltage Vs, but this in no way should be a limitation of the present invention. After that, the operating unit 130 is coupled to the sensing unit 120, and is arranged for generating a mode control signal SC to the mode control unit 140 according to the sensing result (i.e., the sensing voltage Vs). The mode control unit 140 is coupled to the operating unit 130, and is arranged for controlling the handheld device 100 to stay in a handheld mode MD1 or a non-handheld mode MD2 according to the mode control signal SC.

In this embodiment, the operating unit 130 may be implemented by a voltage comparator (e.g., 132), but this in no way should be a limitation of the present invention. The voltage comparator 132 is arranged for comparing the sensing voltage Vs with a threshold voltage $V_{TH}$ in order to generate the mode control signal SC to the mode control unit 140. For example, when the sensing voltage Vs is smaller than the threshold voltage $V_{TH}$ (i.e., Vs<$V_{TH}$), the mode control signal SC has a first logic level (such as, "1"). At this time, the mode control unit 140 may control the handheld device 100 to stay in the handheld mode MD1 according to the mode control signal SC with the first logic level. On the contrary, when the sensing voltage Vs is not smaller than the threshold voltage $V_{TH}$ (i.e., Vs≥$V_{TH}$), the mode control signal SC has a second logic level (such as, "0"). At this time, the mode control unit 140 may control the handheld device 100 to stay in the non-handheld mode MD2 according to the mode control signal SC with the second logic level.

Figure 3:
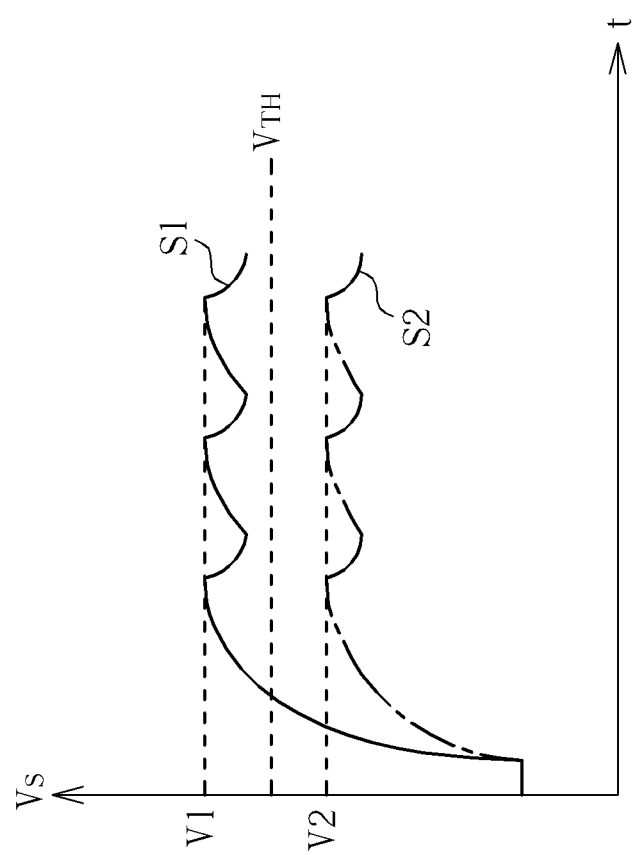
FIG. 3 is a diagram showing signal waveforms of the sensing voltage generated by the sensing unit shown in FIG. 2 under a first condition that a user touch is not received and a second condition that a user touch is received.

Please note that, the handheld device 100 disclosed in the present invention utilizes the sensing unit 120 (which may be implemented by a conductive material attached to the outside surface of the housing of the handheld device 100 or embedded in the housing of the handheld device 100) to sense whether a user touch is received or not, and utilizes the control unit 110 to charge and discharge the sensing unit 120 so as to achieve the goal of differentiating handheld behaviors from non-handheld behaviors. For example, please also refer to FIG. 3. FIG. 3 is a diagram showing signal waveforms of the sensing voltage Vs generated by the sensing unit 120 shown in FIG. 2 under a first condition that a user touch is not received and a second condition that a user touch is received. Under a condition that the fingers or body of a user do not touch the sensing unit 120 of the handheld device 100 (that is, the condition that a user touch is not received), because the control unit 110 may make use of the charging-and-discharging signal Scharge to periodcially charge and discharge the sensing unit 120, the control unit 110 and the sensing unit 120 may form a charging path during a charging stage, and the control unit 110 and the sensing unit 120 may form a discharging path during a discharging stage. Therefore, the sensing voltage Vs of the sensing unit 120 can be maintained at a fixed potential V1, such as a first curve S1 shown in FIG. 3. Under a condition that the fingers or body of a user touch the sensing unit 120 of the handheld device 100 (that is, the condition that a user touch is received), the discharging path and discharging loop of the sensing unit 120 will be changed. In other words, the fingers or body of the user, the control unit 110, the sensing unit 120, and the ground terminal may form another discharging path, and the handheld device 100 may lead out electric charges of the sensing unit 120 via the new discharging path. Therefore, the potential of the sensing voltage Vs of the sensing unit 120 will be changed (decreased), such as a second curve S2 shown in FIG. 3. That is, the sensing voltage Vs of the sensing unit 120 will be lowered down to another potential V2.

Please note that, the abovementioned handheld device 100 may be a mobile phone, a personal digital assistant (PDA), a PDA phone, or a smart phone. But the present invention is not limited to this only, and it can be implemented by a handheld device of other types. Moreover, the abovementioned handheld mode MD1/non-handheld mode MD2 can be related to application settings of the handheld device 100, such as: call vibration control, auto-switch between speaker mode and handheld mode, and volume control. Those skilled in the art should appreciate that various modifications of the handheld mode MD1 and the non-handheld mode MD2 may be made, which can be designed depending upon actual demands.

Figure 4:
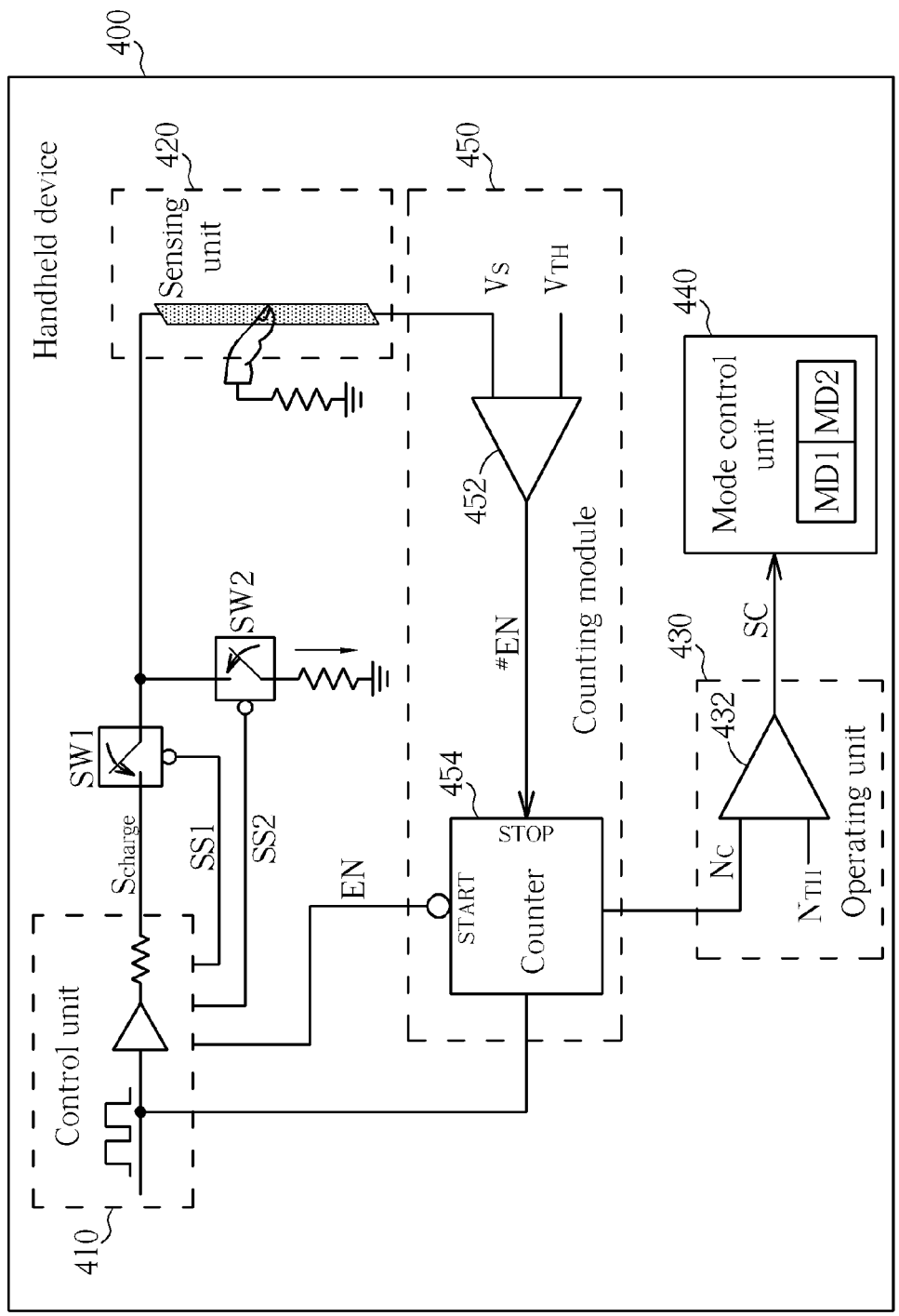
FIG. 4 is a block diagram illustrating the handheld device shown in FIG. 1 according to a second embodiment of the present invention.

Please refer to FIG. 4. FIG. 4 is a block diagram illustrating the handheld device shown in FIG. 1 according to a second embodiment of the present invention. In this embodiment, the handheld device 400 may include, but is not limited to, a control unit 410, a sensing unit 420, an operating unit 430, a mode control unit 440, a counting module 450, a first switch SW1, and a second switch SW2. The operations of the control unit 410 and the sensing unit 420 shown in FIG. 4 are similar to the operations of the control unit 110 and the sensing unit 120 shown in FIG. 2, and the same description is omitted here for brevity. What calls for special attention is that: the control unit 410 is further arranged for generating an enable signal EN to the counting module 450, for generating a first switch signal SS1 to the first switch SW1, and for generating a second switch signal SS2 to the second switch SW2. The counting module 450 is coupled to the control unit 410 and the sensing unit 420. When the enable signal EN is received by the counting module 450, the counting module 450 may start counting a pulse number of the charging-and-discharging signal Scharge (such as, a periodic pulse) sent by the control unit 410. When a user touch is received by the sensing unit 420, the counting module 450 may stop counting the pulse number of the charging-and-discharging signal Scharge (such as, a periodic pulse) in order to output a counting value Nc, wherein the counting value Nc is corresponding to a counting time. After that, the operating unit 430 is coupled to the counting module 450, and is arranged for generating a mode control signal Sc to the mode control unit 440 according to the counting value Nc (or the corresponding counting time). The mode control unit 440 is coupled to the operating unit 430, and is arranged for controlling the handheld device 400 to stay in a handheld mode MD1 or a non-handheld mode MD2 according to the mode control signal SC.

In this embodiment, the counting module 450 may be implemented by a voltage comparator 452 and a counter 454. The voltage comparator 452 is arranged for comparing the sensing voltage Vs with a threshold voltage $V_{TH}$ in order to determine whether to output a disable signal #EN. For example, when the sensing voltage Vs is greater than the threshold voltage $V_{TH}$, the voltage comparator 452 will output the disable signal #EN to the counter 454; and when the sensing voltage Vs is not greater than the threshold voltage $V_{TH}$, the voltage comparator 452 will not output the disable signal #EN to the counter 454. The counter 454 is coupled to the voltage comparator 452, and is arranged for starting counting the pulse number of the charging-and-discharging signal Scharge (e.g., a periodic pulse) when the enable signal EN is received, and for stopping counting the pulse number of the charging-and-discharging signal Scharge to obtain the counting value Nc (or the corresponding counting time) when the disable signal #EN is received.

In addition, the operating unit 430 can be implemented by a comparator (e.g., 432), but the present invention is not limited to this only. The comparator 432 compares the counting value Nc with a threshold value $N_{TH}$ in order to generate the mode control signal SC to the mode control unit 440. For example, when the counting value Nc is smaller than the threshold value $N_{TH}$ (i.e., Nc<$N_{TH}$), the mode control signal SC has a first logic level (such as, "1"). At this time, the mode control unit 440 may utilize the mode control signal SC with the first logic level to control the handheld device 400 to stay in the handheld mode MD1. On the contrary, when the counting value Nc is not smaller than the threshold value $N_{TH}$ (i.e., Nc≥$N_{TH}$), the mode control signal SC has a second logic level (such as, "0"). At this time, the mode control unit 440 may utilize the mode control signal SC with the second logic level to control the handheld device 400 to stay in the non-handheld mode MD2.

Furthermore, the first switch SW1 is coupled between the control unit 410 and the sensing unit 420. The control unit 410 is further arranged for determining whether to turn on or turn off the first switch SW1 according to the first switch signal SS1 in order to determine whether to transmit the charging-and-discharging signal Scharge to the sensing unit 420. The second switch SW2 is coupled between the sensing unit 420 and a ground terminal. The control unit 410 is further arranged for determining whether to turn on or turn off the second switch SW2 according to the second switch signal SS2. What calls for special attention is that: during a charging stage, the first switch SW1 is turned on and the second switch SW2 is turned off. At this time, the control unit 410, the first switch SW1, and the sensing unit 420 form a charging path. During a discharging stage, the first switch SW1 is turned off and the second switch SW2 is turned on. At this time, the second switch SW2 and the sensing unit 420 form a discharging path.

Figure 5:
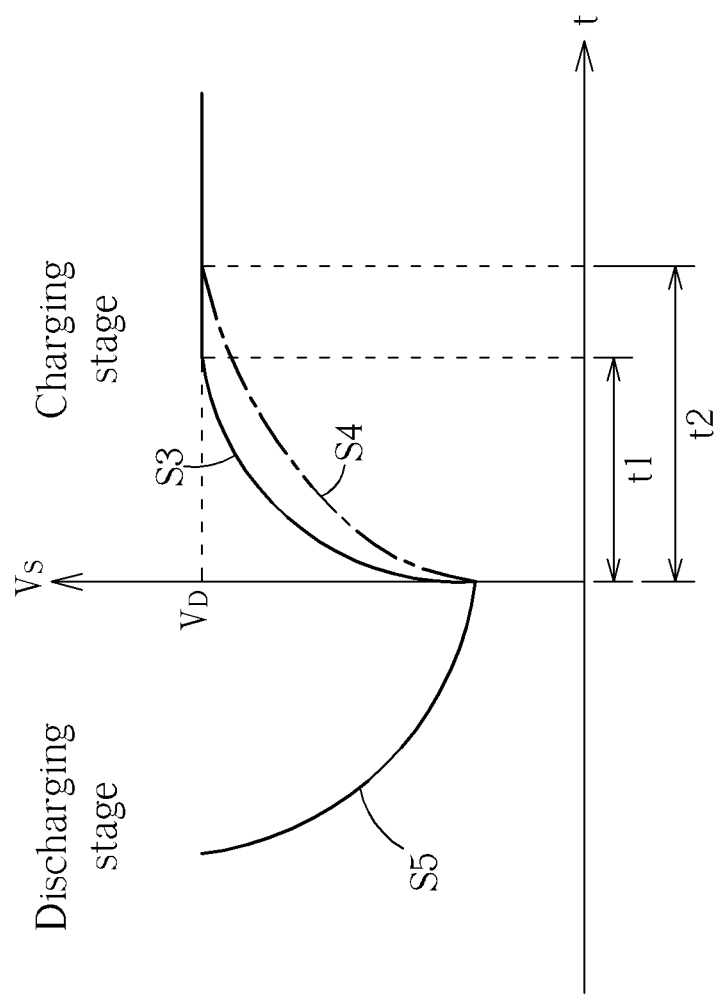
FIG. 5 is a diagram showing signal waveforms of the sensing voltage generated by the sensing unit shown in FIG. 4 during the discharging stage and the charging stage (including a first condition that a user touch is not received and a second condition that a user touch is received).

Please also refer to FIG. 5. FIG. 5 is a diagram showing signal waveforms of the sensing voltage Vs generated by the sensing unit 420 shown in FIG. 4 during the discharging stage and the charging stage (including a first condition that a user touch is not received and a second condition that a user touch is received). First, during the discharging stage, the electronic charges on the conductive material of the sensing unit 420 are exhausted through the discharging path, such as a fifth curve S5 shown in FIG. 5. After that, the charging path is connected during the charging stage. In the following descriptions, two conditions are cited for illustration. Under a first condition that the fingers or body of a user do not touch the sensing unit 420 of the handheld device 400 (that is, the condition that a user touch is not received), because the control unit 410 may make use of the charging-and-discharging signal Scharge to periodcially charge and discharge the sensing unit 420, the sensing voltage Vs of the sensing unit 420 will be charged to reach a predetermined potential VD within a time period t1 (at this time, the counting value Nc is corresponding to a pulse number of N1 pulses), such as a third curve S3 shown in FIG. 5. Under a second condition that the fingers or body of the user do touch the sensing unit 420 of the handheld device 400 (that is, the condition that a user touch is received), the equivalent charge quantity will be changed due to the touch of the fingers or body of the user. For this reason, the charging time of the sensing unit 420 will be changed. At this time, after a time period t2 (at this time, the counting value Nc is corresponding to a pulse number of N2 pulses), the sensing unit 420 will be charged to reach the predetermined potential VD, such as a fourth curve S4 shown in FIG. 5.

In one word, in the abovementioned first embodiment, under the condition that the fingers or body of the user do not touch the sensing unit 120 of the handheld device 100, the sensing voltage Vs will be maintained at the potential V1 and is not smaller than the threshold voltage $V_{TH}$ (i.e., Vs≥$V_{TH}$). At this time, the mode control unit 140 may control the handheld device 100 to stay in the non-handheld mode MD2. Under the condition that the fingers or body of the user do touch the sensing unit 120 of the handheld device 100, the sensing voltage Vs will be lowered down to the potential V2 and is smaller than the threshold voltage $V_{TH}$ (i.e., Vs<$V_{TH}$). At this time, the mode control unit 140 may control the handheld device 100 to stay in the handheld mode MD1.

Besides, in the abovementioned second embodiment, under the condition that the fingers or body of the user do not touch the sensing unit 420 of the handheld device 400, the sensing voltage Vs of the sensing unit 420 will be charged to reach the predetermined potential VD after the time period t1. That is to say, the counting value Nc (or the counting time) obtained by the counting module 450 is smaller (i.e., Nc<$N_{TH}$). At this time, the mode control unit 440 may control the handheld device 400 to stay in the non-handheld mode MD2. Under the condition that the fingers or body of the user do touch the sensing unit 420 of the handheld device 400, the sensing voltage Vs of the sensing unit 420 will be charged to reach the predetermined potential VD after the time period t2. That is to say, the counting value Nc (or the counting time) obtained by the counting module 450 is larger (i.e., Nc≥$N_{TH}$). At this time, the mode control unit 440 may control the handheld device 400 to stay in the handheld mode MD1. Therefore, the handheld device 100/400 can achieve a goal of automatically switching or controlling the handheld mode/non-handheld mode, which can add more functionality to the handheld device 100/400 and bring more convenience to the user.

Figure 6:
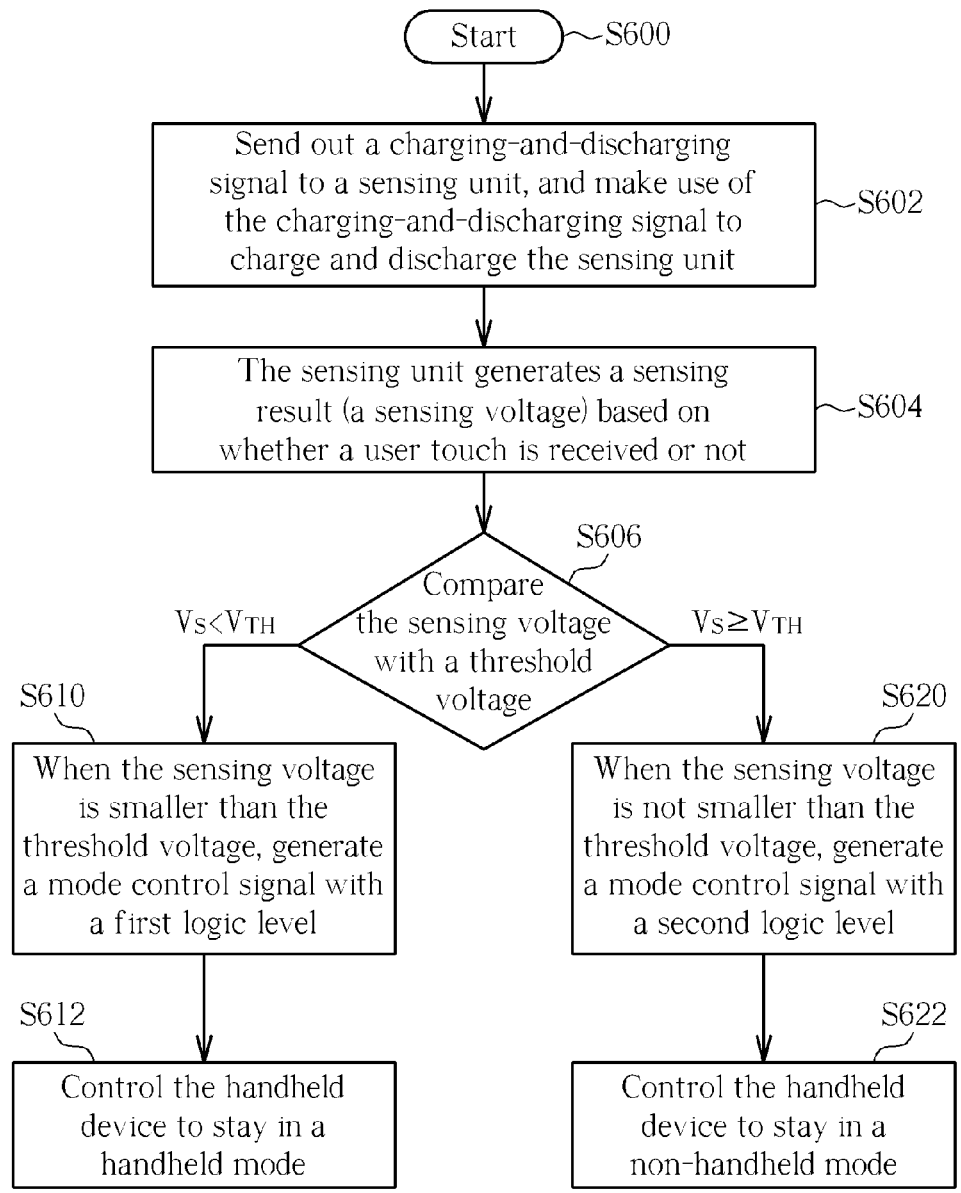
FIG. 6 is a flowchart illustrating a method for controlling modes of a handheld device according to an exemplary embodiment of the present invention.

Please refer to FIG. 6. FIG. 6 is a flowchart illustrating a method for controlling modes of a handheld device according to an exemplary embodiment of the present invention. Please note that the following steps are not limited to be performed according to the exact sequence shown in FIG. 6 if a roughly identical result can be obtained. The method includes, but is not limited to, the following steps:

Step S600: Start.

Step S602: Send out a charging-and-discharging signal to a sensing unit, and make use of the charging-and-discharging signal to charge and discharge the sensing unit.

Step S604: The sensing unit generates a sensing result (a sensing voltage) based on whether a user touch is received or not.

Step S606: Compare the sensing voltage with a threshold voltage. When the sensing voltage is smaller than the threshold voltage, go to the step S610; otherwise, go to the step S620.

Step S610: When the sensing voltage is smaller than the threshold voltage, generate a mode control signal with a first logic level.

Step S612: Control the handheld device to stay in a handheld mode according to the mode control signal with the first logic level.

Step S620: When the sensing voltage is not smaller than the threshold voltage, generate a mode control signal with a second logic level.

Step S622: Control the handheld device to stay in a non-handheld mode according to the mode control signal with the second logic level.

How each element operates can be known by combining the steps shown in FIG. 6 together with the elements shown in FIG. 1 and FIG. 2 and the signal waveforms shown in FIG. 3. Therefore, further description for the operations of the steps shown in FIG. 6 is omitted here for brevity. Please note that: the steps S610~S612 represent the condition that the handheld device 100 is under the handheld mode MD1, and the steps S620~S622 represent the condition that the handheld device 100 is under the non-handheld mode MD2.

Figure 7:
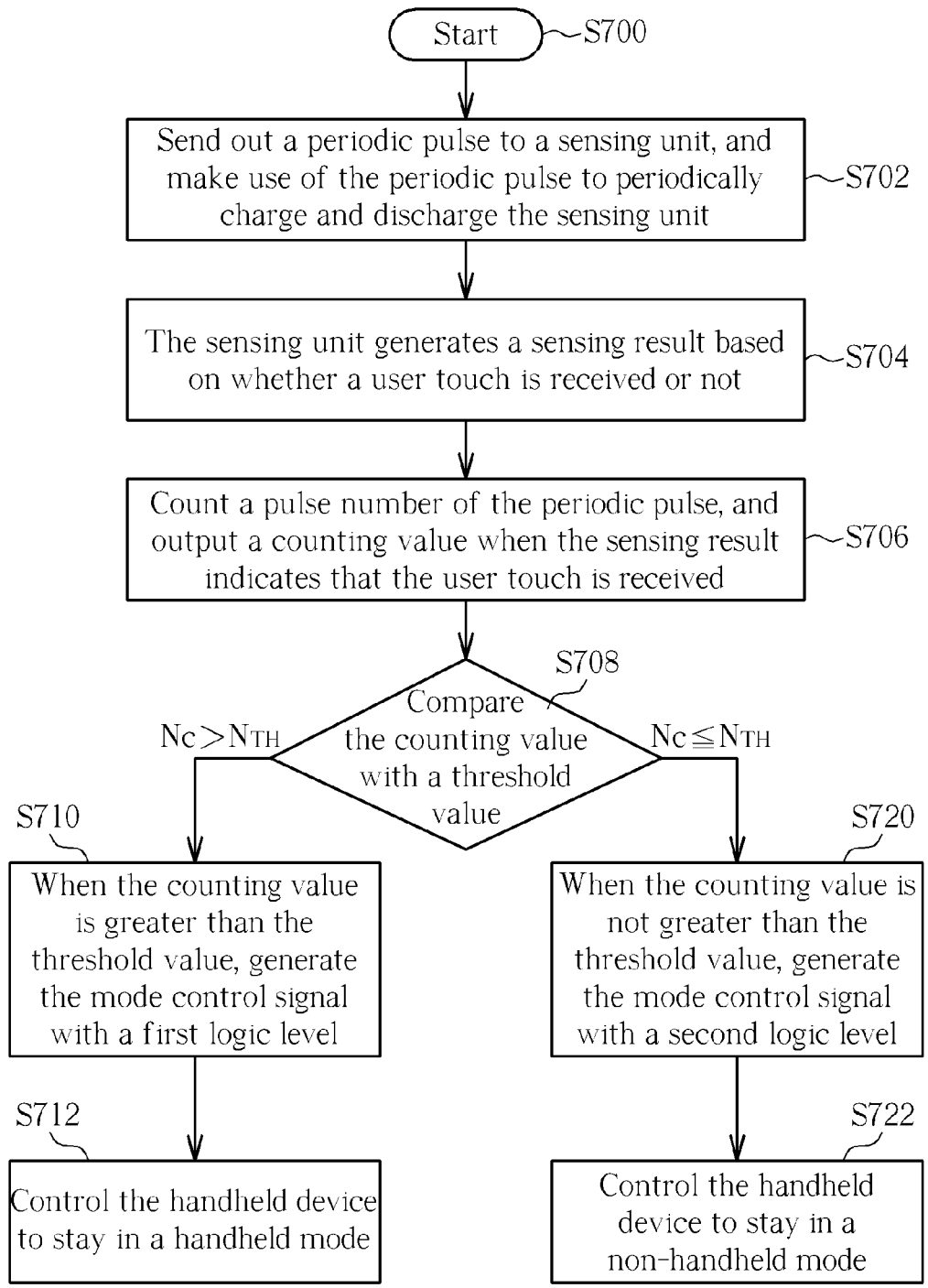
FIG. 7 is a flowchart illustrating a method for controlling modes of a handheld device according to another exemplary embodiment of the present invention.

Please refer to FIG. 7. FIG. 7 is a flowchart illustrating a method for controlling modes of a handheld device according to another exemplary embodiment of the present invention. The method includes, but is not limited to, the following steps:

Step S700: Start.

Step S702: Send out a periodic pulse to a sensing unit, and make use of the periodic pulse to periodically charge and discharge the sensing unit.

Step S704: The sensing unit generates a sensing result based on whether a user touch is received or not.

Step S706: Count a pulse number of the periodic pulse, and output a counting value when the sensing result indicates that the user touch is received.

Step S708: Compare the counting value with a threshold value. When the counting value is greater than the threshold value, go to the step S710; otherwise, go to the step S720.

Step S710: When the counting value is greater than the threshold value, generate the mode control signal with a first logic level.

Step S712: Control the handheld device to stay in a handheld mode according to the mode control signal with the first logic level.

Step S720: When the counting value is not greater than the threshold value, generate the mode control signal with a second logic level.

Step S722: Control the handheld device to stay in a non-handheld mode according to the mode control signal with the second logic level.

How each element operates can be known by combining the steps shown in FIG. 7 together with the elements shown in FIG. 1 and FIG. 4 and the signal waveforms shown in FIG. 5. Therefore, further description for the operations of the steps shown in FIG. 7 is omitted here for brevity. Please note that: the steps S710~S712 represent the condition that the handheld device 400 is under the handheld mode MD1, and the steps S720~S722 represent the condition that the handheld device 400 is under the non-handheld mode MD2.

Please note that, the steps of the abovementioned flowchart are merely practicable embodiments of the present invention, and in no way should be considered to be limitations of the scope of the present invention. These methods can include other intermediate steps or several steps can be merged into a single step without departing from the spirit of the present invention.

The abovementioned embodiments are presented merely for describing features of the present invention, and in no way should be considered to be limitations of the scope of the present invention. In summary, the present invention provides a handheld device capable of automatically switching between a handheld mode and a non-handheld mode and a related control method. By using a sensing unit (which can be implemented by a conductive material attached to the outside surface of the housing of the handheld device or embedded in the housing of the handheld device) to sense whether a user touch is received, and by using a control unit to charge and discharge the sensing unit, the original discharging path and electric charges will be changed under the condition that the sensing unit (such as, the conductive material) of the handheld device is touched by the fingers or body of the user, such that handheld behaviors and non-handheld behaviors can be differentiated. Therefore, the settings of the handheld device can be automatically adjusted in response to the handheld behaviors and the non-handheld behaviors. For example, application functions such as: call vibration control, auto-switch between speaker mode and handheld mode, and volume control can be added to the handheld device. As a result, the mechanism disclosed in the present invention can add more functionality to the handheld device and bring more convenience to the user.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A handheld device capable of automatically switching between a handheld mode and a non-handheld mode, comprising:
   a sensing unit, arranged for generating a sensing result based on whether a user touch is received or not;
   a control unit, arranged for sending out a periodic pulse to the sensing unit, and for making use of the periodic pulse to periodically charge and discharge the sensing unit;
   a counting module, coupled to the control unit and the sensing unit, arranged for counting a pulse number of the periodic pulse, and for outputting a counting value when the sensing result indicates that the user touch is received;
   an operating unit, coupled to the counting module, arranged for generating a mode control signal according to the counting value; and
   a mode control unit, coupled to the operating unit, arranged for controlling the handheld device to stay in the handheld mode or the non-handheld mode according to the mode control signal.

2. The handheld device according to claim 1, wherein the control unit is further arranged for generating a first switch signal and a second switch signal, and the handheld device further comprises:
   a first switch, coupled between the control unit and the sensing unit, arranged for determining whether to turn on or turn off the first switch according to the first switch signal in order to transmit the periodic pulse to the sensing unit; and
   a second switch, coupled between the sensing unit and a ground terminal, arranged for determining whether to turn on or turn off the second switch according to the second switch signal.

3. The handheld device according to claim 2, wherein during a charging stage, the first switch is turned on and the second switch is turned off; and wherein the control unit, the first switch and the sensing unit form a charging path.

4. The handheld device according to claim 2, wherein during a discharging stage, the first switch is turned off and the second switch is turned on; and wherein the second switch and the sensing unit form a discharging path.

5. The handheld device according to claim 1, wherein the sensing result is a sensing voltage, and the counting module is arranged for determining whether to output the counting value by measuring a magnitude of the sensing voltage.

6. The handheld device according to claim 5, wherein the control unit is further arranged for generating an enable signal, and the counting module comprises:

a counter, arranged for starting counting the pulse number of the periodic pulse when the enable signal is received, and for stopping counting the pulse number of the periodic pulse to obtain the counting value when a disable signal is received; and a voltage comparator, arranged for comparing the sensing voltage with a threshold voltage in order to determine whether to output the disable signal;

wherein when the sensing voltage is greater than the threshold voltage, the disable signal is outputted to the counter; and when the sensing voltage is not greater than the threshold voltage, the disable signal is not outputted to the counter.

7. The handheld device according to claim 1, wherein the operating unit comprises:

a comparator, arranged for comparing the counting value with a threshold value in order to generate the mode control signal;

wherein when the counting value is greater than the threshold value, the mode control signal has a first logic level; and wherein the mode control unit controls the handheld device to stay in the handheld mode according to the mode control signal with the first logic level; and when the counting value is not greater than the threshold value, the mode control signal has a second logic level; and wherein the mode control unit controls the handheld device to stay in the non-handheld mode according to the mode control signal with the second logic level.

8. The handheld device according to claim 1, wherein the sensing unit comprises a conductive material.

9. The handheld device according to claim 1, wherein the sensing unit is arranged for receiving the user touch by way of indirect induction or direct contact.

10. A method for controlling modes of a handheld device, comprising the following steps:

sending out a periodic pulse to a sensing unit, and making use of the periodic pulse to periodically charge and discharge the sensing unit;

the sensing unit generating a sensing result based on whether a user touch is received or not;

counting a pulse number of the periodic pulse, and outputting a counting value when the sensing result indicates that the user touch is received;

generating a mode control signal according to the counting value; and controlling the handheld device to stay in a handheld mode or a non-handheld mode according to the mode control signal.

11. The method according to claim 10, further comprising:
generating a first switch signal and a second switch signal;

determining whether to turn on or turn off the first switch according to the first switch signal in order to transmit the periodic pulse to the sensing unit; and determining whether to turn on or turn off the second switch according to the second switch signal in order to couple the sensing unit to a ground terminal;

wherein during a charging stage, the first switch is turned on and the second switch is turned off; and wherein during a discharging stage, the first switch is turned off and the second switch is turned on.

12. The method according to claim 10, wherein the sensing result is a sensing voltage, and the step of outputting the counting value comprises:

determining whether to output the counting value by measuring a magnitude of the sensing voltage.

13. The method according to claim 12, wherein the step of determining whether to output the counting value by measuring the magnitude of the sensing voltage further comprises:

comparing the sensing voltage with a threshold voltage;

when the sensing voltage is greater than the threshold voltage, outputting a disable signal; and when the sensing voltage is not greater than the threshold voltage, not outputting the disable signal.

14. The method according to claim 13, further comprising:
generating an enable signal;

when the enable signal is received, starting counting the pulse number of the periodic pulse; and when the disable signal is received, stopping counting the pulse number of the periodic pulse to obtain the counting value.

15. The method according to claim 10, wherein the step of generating the mode control signal according to the counting value comprises:

comparing the counting value with a threshold value;

when the counting value is greater than the threshold value, generating the mode control signal with a first logic level; and when the counting value is not greater than the threshold value, generating the mode control signal with a second logic level; and the step of controlling the handheld device to stay in the handheld mode or the non-handheld mode according to the mode control signal further comprises:

when the counting value is greater than the threshold value, controlling the handheld device to stay in the handheld mode according to the mode control signal with the first logic level; and when the counting value is not greater than the threshold value, controlling the handheld device to stay in the non-handheld mode according to the mode control signal with the second logic level.

* * * * *